(12) United States Patent
Kato et al.

(10) Patent No.: US 7,541,879 B2
(45) Date of Patent: Jun. 2, 2009

(54) SYSTEM FOR COMPENSATION OF VCO NON-LINEARITY

(75) Inventors: Akira Kato, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 11/902,597

(22) Filed: Sep. 24, 2007

(65) Prior Publication Data

US 2009/0079507 A1 Mar. 26, 2009

(51) Int. Cl.
*H03L 7/00* (2006.01)
(52) U.S. Cl. ............................ 331/16; 331/17; 331/34; 327/156; 375/376
(58) Field of Classification Search .................. 331/17, 331/16, 34; 327/156; 375/376
See application file for complete search history.

(56) References Cited

U.S. PATENT DOCUMENTS 6,774,738 B2 * 8/2004 Hammes et al. ............. 332/100
7,002,416 B2 * 2/2006 Pettersen et al. ............. 331/16
7,061,341 B1   6/2006 Groe

* cited by examiner

*Primary Examiner*—Arnold Kinkead
(74) *Attorney, Agent, or Firm*—Wenderoth, Lind & Ponack, L.L.P.

(57) ABSTRACT

A nonlinearity-compensated section has a pre-set compensation table containing a measured value of a voltage vtc, outputted from a loop filter, which is changed accordingly with respect to a change in a voltage vtfc outputted from a frequency controlling section. The nonlinearity-compensated section sets, in the compensation table, the voltage vtfc of an oscillatory frequency oscillated by a VCO and the voltage vtc associated therewith as reference voltages, and creates a look-up table containing voltage differences obtained by subtracting the above-described reference voltages from the voltages vtfc and vtc, respectively. Thereafter, the nonlinearity-compensated section extracts a compensation value corresponding to the voltage vtc actually outputted from the loop filter by means of the look-up table, and adds the compensation value to an input modulated signal adjusted by a multiplier so as to be outputted.

4 Claims, 6 Drawing Sheets

FIG. 2

| vtfc | vtc |
|---|---|
| ⋮ | ⋮ |
| 0.50v | 0.474v |
| 0.51v | 0.482v |
| 0.52v | 0.491v |
| 0.53v | 0.500v |
| 0.54v | 0.508v |
| ⋮ | ⋮ |
| 1.29v | 1.231v |
| 1.30v | 1.240v |
| ⋮ | ⋮ |

FIG. 3

| vtfc-0.52v | vtc-0.491v |
|---|---|
| ⋮ | ⋮ |
| -0.02v | -0.017v |
| -0.01v | -0.009v |
| 0v | 0v |
| 0.01v | 0.009v |
| 0.02v | 0.018v |
| ⋮ | ⋮ |
| 0.77v | 0.740v |
| 0.78v | 0.749v |
| ⋮ | ⋮ |

| vtfc | LOW TEMPERATURE THRESHOLD VALUE | HIGH TEMPERATURE THRESHOLD VALUE |
|---|---|---|
| vtfc(1) | vthl(1) | vthh(1) |
| vtfc(2) | vthl(2) | vthh(2) |
| ⋮ | ⋮ | ⋮ |
| vtfc(m) | vthl(m) | vthh(m) |
| ⋮ | ⋮ | ⋮ |
| vtfc(n) | vthl(n) | vthh(n) |

SYSTEM FOR COMPENSATION OF VCO NON-LINEARITY

BACKGROUND OF THE INVENTION

1. Field of the Invention

The present invention relates to a VCO nonlinear compensation system for compensating a nonlinearity of a voltage-controlled oscillator (VCO).

2. Description of the Background Art

Conventionally, various methods of causing an oscillatory frequency response of a VCO to be changed linearly have been used. FIG. 8 is a diagram illustrating a configuration of a conventional direct synthesis modulator 600, for generating a communication carrier frequency, which is disclosed in U.S. Pat. No. 7,061,341.

The conventional direct synthesis modulator 600 has a PLL circuit including a voltage-controlled oscillator 604, an N-divider (N counter) 606, a phase comparator 608, a charge pump (CP) 616 and a RC coupling filter.

A phase signal 610 corresponding to a desired channel is converted by a delta-sigma modulator of a digital differential circuit 612 into a digital signal, and then further converted by a D/A converter into an analog signal. Thereafter, the analog signal is inputted to an auxiliary terminal 602 of the voltage-controlled oscillator 604 via an LPF 614. On the other hand, a modulated signal outputted from the digital differential circuit 612 is supplied to the N-divider 606 after being matched with a data rate of a control signal.

With such a configuration, a signal obtained by dividing an output of the voltage-controlled oscillator 604 by N is compared with the modulated signal in the phase comparator 608 and a feedback on a difference between the two signals is provided, thereby compensating for a nonlinearity of the voltage-controlled oscillator 604.

However, the auxiliary terminal 602 of the voltage-controlled oscillator 604 has a function of controlling not a phase but an oscillatory frequency. Therefore, a phase modulator is required for shifting a phase of the voltage-controlled oscillator 604.

Furthermore, a D/A converter or a down-converter, for example, is required for providing the feedback. As a result, a circuit becomes complicated and the number of components included in the circuit is increased, whereby it is difficult to adjust a timing of the feedback.

SUMMARY OF THE INVENTION

Therefore, an object of the present invention is to provide a VCO nonlinear compensation system, having a simple circuit configuration, which requires no timing adjustment of a feedback and is capable of compensating for a nonlinearity of a VCO.

The present invention is directed to a system for compensating for a nonlinearity of a voltage-controlled oscillator. In order to attain the aforementioned object, the system of the present invention comprises: a loop filter operable to suppress a high-frequency component of an input modulated signal; a voltage-controlled oscillator operable to control an oscillatory frequency in accordance with a signal outputted from the loop filter so as to perform a frequency modulation on the input modulated signal; a feedback processing section operable to compare a frequency modulated signal outputted from the voltage-controlled oscillator with the input modulated signal and operable to control, based on a comparison result, the frequency of the input modulated signal to be inputted to the loop filter; and a nonlinearity-compensated section operable to retain a compensation table in which a voltage vtfc for setting a center frequency of the frequency modulated signal is associated with a voltage vtc of the signal outputted from the loop filter, and operable to add, when the frequency modulated signal is oscillated at a center frequency fc, a compensation value to the input modulated signal, the compensation value being calculated based on a difference between a pair of the voltage vtfc and the voltage vtc, in the compensation table, both of which are associated with the center frequency fc and another pair of the voltage vtfc and the voltage vtc, in the compensation table, both of which are associated with a frequency other than the center frequency fc.

In a configuration mentioned above, it is preferable that the system of the present invention further comprises an offset setting section operable to retain an offset value changed in accordance with a change in an environmental temperature and determining, based on the voltage vtc which is actually obtained, the offset value to be assigned to values in the compensation table, and the nonlinearity-compensated section adds the offset value determined by the offset setting section to the values in the compensation table. Note that the compensation table may be created either when a product is adjusted in a factory or when a power source of the system is turned on.

According to the present invention, with a simple configuration, the nonlinearity of the VCO can be compensated for without adjusting a timing of the feedback.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram illustrating an exemplary compensation table retained by a nonlinearity-compensated section 23;

FIG. 3 is a diagram for describing a compensation process executed by the nonlinearity-compensated section 23 by means of the compensation table shown in FIG. 2;

DESCRIPTION OF THE PREFERRED EMBODIMENTS

First Embodiment

Figure 1:
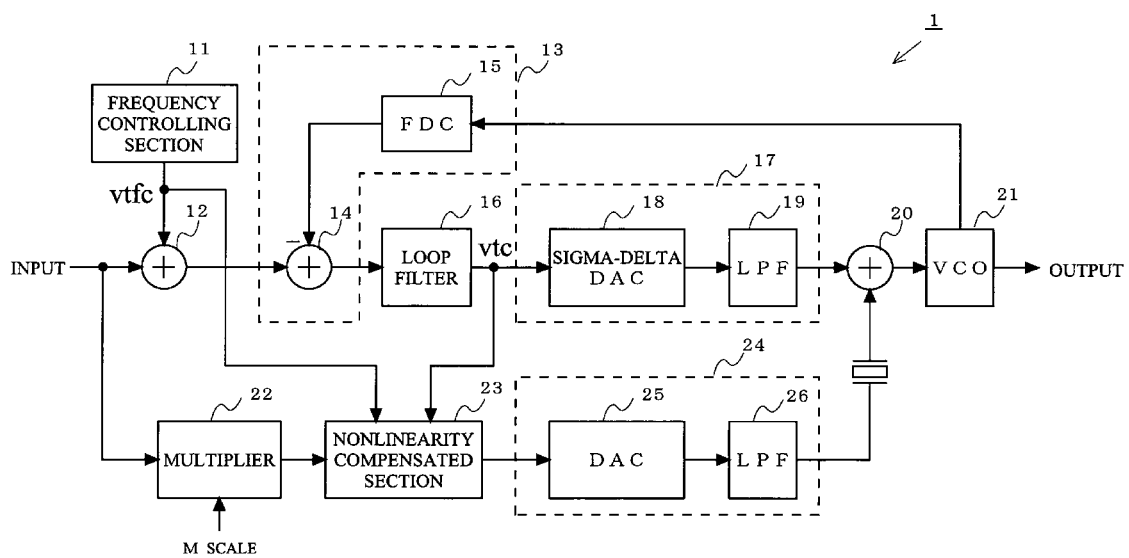
FIG. 1 is a diagram illustrating an exemplary configuration of a VCO nonlinear compensation system 1 according to a first embodiment of the present invention.

FIG. 1 is a diagram illustrating an exemplary configuration of a VCO nonlinear compensation system 1 according to a first embodiment of the present invention. In FIG. 1, the VCO nonlinear compensation system 1 according to the first embodiment comprises a frequency controlling section 11, a first adder 12, a feedback processing section 13 including a first subtractor 14 and a frequency digital converter (FDC) 15, a loop filter 16, a first signal processing section 17 including a sigma-delta DA converter (DAC) 18 and a low-path filter (LPF) 19, a voltage-controlled oscillator (VCO) 21, a second adder 20, a multiplier 22, a nonlinearity-compensated section 23, and a second signal processing section 24 including a DAC 25 and an LPF 26.

Firstly, an outline of respective components included in the VCO nonlinear compensation system 1 according to the first embodiment of the present invention will be described.

To each of the first adder 12 and the multiplier 22, a predetermined signal is inputted. Then, one input modulated signal outputted from the first adder 12 is inputted to the second adder 20 via a path on which the first adder 12, the first subtractor 14, the loop filter 16, the sigma-delta DAC 18 and the LPF 19 are provided. The other input modulated signal outputted from the multiplier 22 is inputted to the second adder 20 via another path on which the multiplier 22, the nonlinearity-compensated section 23, the DAC 25 and the LPF 26 are provided. The second adder 20 combines the two input modulated signals outputted through the respective paths so as to be outputted to the VCO 21. By controlling an oscillatory frequency in accordance with the combined input modulated signal, the VCO 21 performs a frequency modulation on the combined input modulated signal so as to be outputted as a frequency modulated signal.

The frequency controlling section 11 outputs a voltage vtfc for controlling a center frequency of the input modulated signal. The first adder 12 adds the voltage vtfc to the input modulated signal. The FDC 15 converts a frequency of the frequency modulated signal outputted from the VCO 21 into a digital value, and outputs the digital value to the first subtractor 14. The first subtractor 14 subtracts the digital value, which is outputted from the FDC 15, from the input modulated signal outputted from the first adder 12 so as to be outputted to the loop filter 16. In other words, the first subtractor 14 compares the digital value outputted from the FDC 15 with the input modulated signal outputted from the first adder 12. The loop filter 16 suppresses a high-frequency component of the input modulated signal outputted from the first subtractor 14. The sigma-delta DAC 18 converts the input modulated signal whose high-frequency component has been suppressed into an analog signal. The LPF 19 is a filter for suppressing noise such as quantization noise caused by a process executed by the sigma-delta DAC 18. With such a configuration, the frequency of the frequency modulated signal outputted from the VCO 21 can be stabilized.

On the other hand, the multiplier 22 multiplies the input modulated signal by a predetermined M-scale so as to be adjusted. The nonlinearity-compensated section 23 retains a compensation table in which the voltage vtfc for setting the center frequency of the input modulated signal is associated with a voltage vtc of the signal outputted from the loop filter 16. Then, based on the compensation table, the nonlinearity-compensated section 23 adds, to the adjusted input modulated signal, a compensation value corresponding to the voltage vtfc for setting the center frequency so as to be outputted. The DAC 25 converts the input modulated signal to which the compensation value has been added into an analog signal. The LPF 26 is a filter for suppressing noise such as quantization noise caused by a process executed by the DAC 25.

Next, the compensation table retained by the nonlinearity-compensated section 23 will be described. FIG. 2 is a diagram illustrating an exemplary compensation table retained by the nonlinearity-compensated section 23.

The compensation table retained by the nonlinearity-compensated section 23 is typically created before a product is shipped from a factory, i.e., when the product is adjusted in the factory. The compensation table contains a measured value of the voltage vtc, outputted from the loop filter 16, which is changed accordingly with respect to a change in the voltage vtfc outputted from the frequency controlling section 11. The exemplary compensation table of FIG. 2 shows a result obtained by measuring, when the voltage vtfc is increased in increments of 0.01V, the voltage vtc which is changed accordingly with respect thereto. Note that the voltage vtc is measured without inputting the input modulated signal to the VCO nonlinear compensation system 1. The voltage vtc is measured in the above-described manner, thereby making it possible to recognize a nonlinear characteristic of the VCO 21.

Next, a method in which the nonlinearity-compensated section 23 compensates for a nonlinearity of the VCO 21 by means of the compensation table will be described. FIG. 3 is a diagram for describing a compensation process executed by the nonlinearity-compensated section 23 by means of the compensation table shown in FIG. 2.

Now, it is assumed that "the voltage vtfc=0.52V" is set in the VCO nonlinear compensation system 1. In this case, the nonlinearity-compensated section 23 sets "voltage vtfc=0.52V, the voltage vtc=0.491V" in the compensation table as reference voltages, and creates a look-up table (FIG. 3) containing voltage differences (i.e., the compensation value) obtained by subtracting the above-described reference voltages from the voltages vtfc and vtc, respectively. Then, the nonlinearity-compensated section 23 adds the compensation value to the input modulated signal having been adjusted by the multiplier 22 by means of the look-up table.

As described above, in the VCO nonlinear compensation system 1 according to the first embodiment of the present invention, a nonlinearity of the VCO 21 can be compensated for without adjusting a timing of a feedback. Furthermore, the nonlinearity-compensated section 23 is provided outside a feedback processing path, and therefore a circuit configuration can be simplified.

Second Embodiment

The compensation table used in the first embodiment is created when the product is adjusted in the factory. Therefore, values in the compensation table are nonlinearity compensation values at an ambient temperature in the factory. However, the VCO nonlinear compensation system 1 is used under various temperatures. Thus, with only one compensation table, it is difficult to sufficiently compensate for the nonlinearity of the VCO 21.

Therefore, a second embodiment will describe a configuration capable of changing the compensation table in accordance with a temperature at which the system is used (i.e., an environmental temperature).

Figure 4:
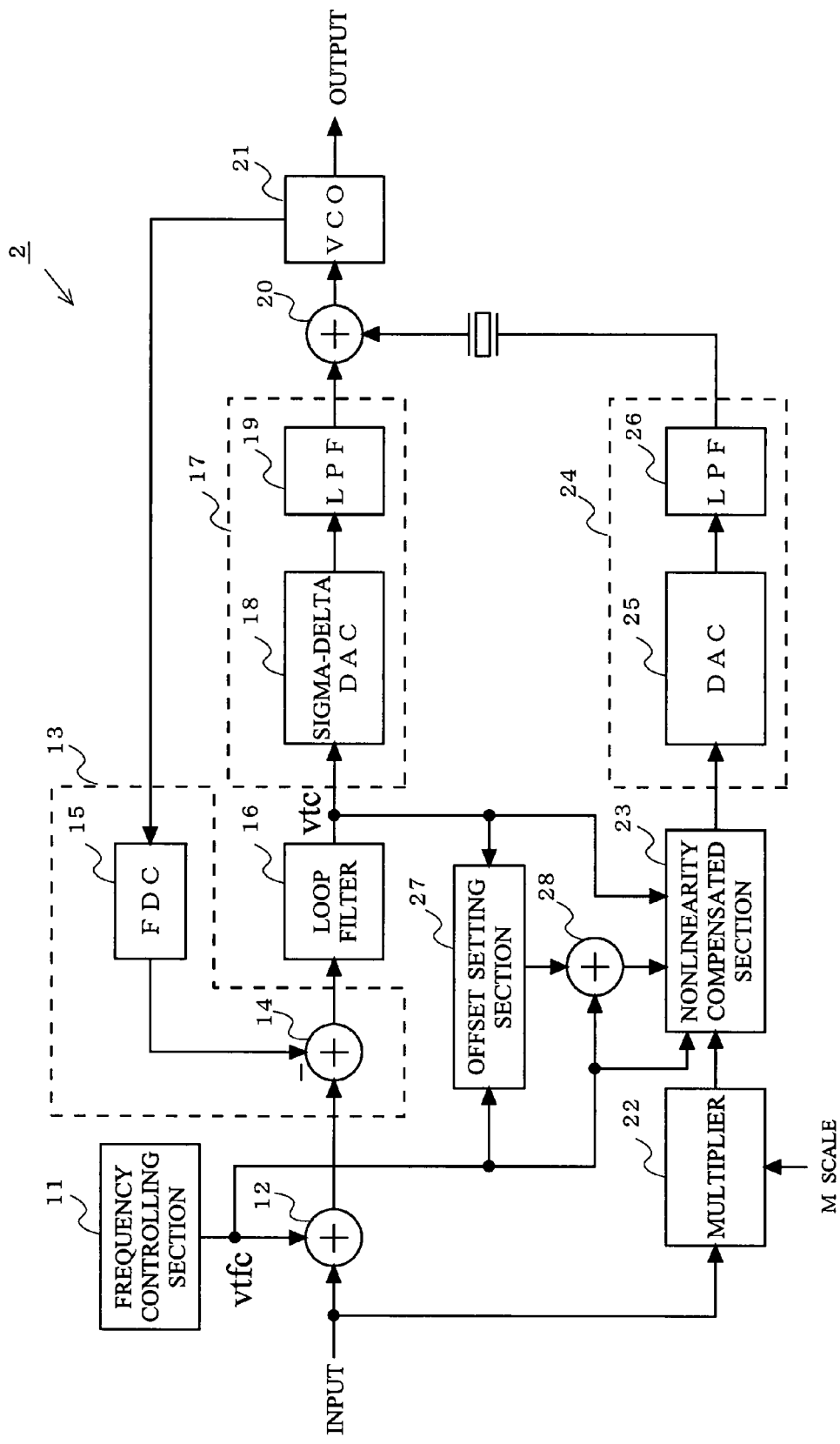
FIG. 4 is a diagram illustrating an exemplary configuration of a VCO nonlinear compensation system 2 according to a second embodiment of the present invention.

FIG. 4 is a diagram illustrating an exemplary configuration of a VCO nonlinear compensation system 2 according to the second embodiment of the present invention. In FIG. 4, the VCO nonlinear compensation system 2 according to the second embodiment comprises the frequency controlling section 11, the first adder 12, the feedback processing section 13 including the first subtractor 14 and the FDC 15, the loop filter 16, the first signal processing section 17 including the sigma-delta DAC 18 and the LPF 19, the second adder 20, the VCO 21, the multiplier 22, an offset setting section 27, a third adder 28, the nonlinearity-compensated section 23, and the second signal processing section 24 including the DAC 25 and the LPF 26.

As shown in FIG. 4, the configuration of the VCO nonlinear compensation system 2 of the second embodiment is the same as that of the VCO nonlinear compensation system 1 of the first embodiment except that the offset setting section 27 and the third adder 28 are additionally provided in the VCO nonlinear compensation system 2.

Hereinafter, the second embodiment will be described mainly with respect to this difference. In the second embodiment, same components as those of the first embodiment will be denoted by the same reference numerals and will not be further described below.

Figures 5, 6:
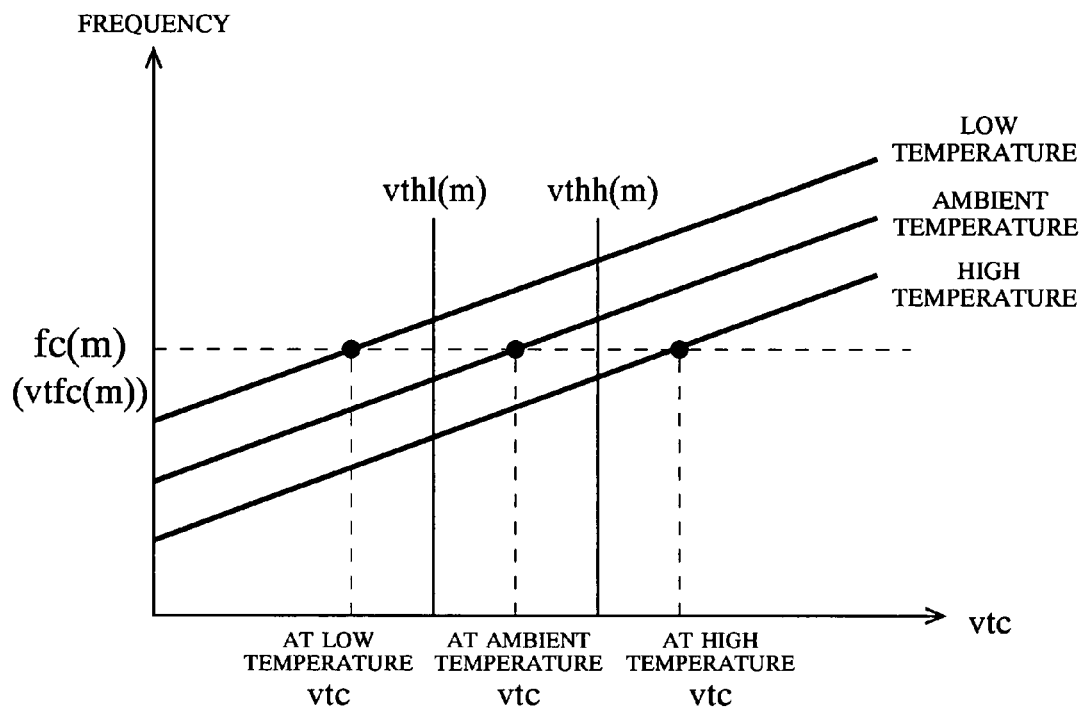
FIG. 5 is an exemplary threshold value table created by an offset setting section 27.
FIG. 6 is a diagram for describing preferable setting examples of a high temperature threshold value vthh and a low temperature threshold value vthl.

Referring to FIG. 5, an offset value set by the offset setting section 27 will be described. FIG. 5 is an exemplary threshold value table created by the offset setting section 27.

The compensation table retained by the nonlinearity-compensated section 23 is also created when the product is adjusted in the factory in a similar manner to that of the first embodiment. Therefore, values in the created compensation table are measured at the environmental temperature of the factory (25° C., for example). In the second embodiment, the voltage vtc is also measured at, for example, a high temperature (90° C.) and a low temperature (−40° C.), other than at the environmental temperature of the factory.

Then, the offset setting section 27 determines, for each predetermined voltage vtfc (center frequency), a high temperature threshold value vthh based on the voltage vtc at the environmental temperature of the factory and the voltage vtc at the high temperature, and a low temperature threshold value vthl based on the voltage vtc at the environmental temperature of the factory and the voltage vtc at the low temperature (FIG. 5). The high temperature threshold value vthh and the low temperature threshold value vthl can be set freely. However, it is desirable that the high temperature vthh is set at an intermediate value between the voltage vtc at the environmental temperature and the voltage vtc at the high temperature, and the low temperature threshold value vthl is set at an intermediate value between the voltage vtc at the low temperature and the voltage vtc at the environmental temperature (FIG. 6).

Next, described will be a method in which the offset setting section 27, the third adder 28 and the nonlinearity-compensated section 23 compensate for the nonlinearity of the VCO 21 by means of the high temperature threshold value vthh, the low temperature threshold value vthl and the compensation table.

Now, it is assumed that "the voltage vtfc=0.52V" is set in the VCO nonlinear compensation system 2. The offset setting section 27 inputs the voltage vtfc (fixed at 0.52V) and the voltage vtc (a currently measured value). Note that the voltage vtc to be inputted will be approximately 0.491V if the environmental temperature of the VCO nonlinear compensation system 2 is in the vicinity of the ambient temperature (25° C.). And the voltage vtc to be inputted will be higher than 0.491V if the environmental temperature of the VCO nonlinear compensation system 2 is also higher than the ambient temperature, and lower than 0.491V if the environmental temperature of the VCO nonlinear compensation system 2 is also lower than the ambient temperature. Thus, the value of the voltage vtc to be inputted is determined, thereby making it possible to approximately recognize the environmental temperature of the VCO nonlinear compensation system 2.

By means of the threshold value table, the offset setting section 27 determines whether or not the voltage vtc to be inputted exceeds the high temperature threshold value vthh or the low temperature threshold value vthl, thereby determining an offset value as shown below, for example.

voltage vtc≦voltage vthl→offset value 1 voltage vthl<voltage vtc<voltage vthh→0 voltage vthh≦voltage vtc→offset value 2

Then, the third adder 28 adds the offset value determined by the offset setting section 27 to the voltage vtfc outputted from the frequency controlling section 11, so as to be outputted to the nonlinearity-compensated section 23. In response to this, the nonlinearity-compensated section 23 sets "the voltage vtfc=0.52V+the offset value, the voltage vtc=a voltage associated with the voltage vtfc (=0.52V+the offset value)" in the compensation table as the reference voltages, and creates a look-up table containing the voltage differences (i.e., the compensation value) obtained by subtracting the above-described reference voltages from the voltages vtfc and vtc, respectively. Then, the nonlinearity-compensated section 23 adds the compensation value to the input modulated signal having been adjusted by the multiplier 22 by means of the look-up table, so as to be outputted.

As described above, in the VCO nonlinear compensation system 2 according to the second embodiment of the present invention, the nonlinearity of the VCO 21 can be compensated for, taking into consideration the environmental temperature of the VCO nonlinear compensation system 2. Furthermore, the nonlinearity-compensated section 23 is provided outside the feedback processing path, and therefore a circuit configuration can be simplified.

Although the above second embodiment describes the environmental temperature divided into three temperature zones which are the ambient temperature, the high temperature and the low temperature, a method of determining the offset value or the like, these are merely examples. The number of zones into which the environmental temperature is divided or the number of the offset values to be used may be set freely. The environmental temperature may be further divided into more than three zones, or three or more offset values may be provided.

Third Embodiment

The above first and second embodiments illustrate an example where the compensation table is created when the product is adjusted in the factory. However, the compensation table may be created at times other than when the product is adjusted in the factory.

A third embodiment will describe a case where the compensation table is created, for example, when a power source of the system is turned on, i.e., a case where an initial training is performed.

Figure 7:
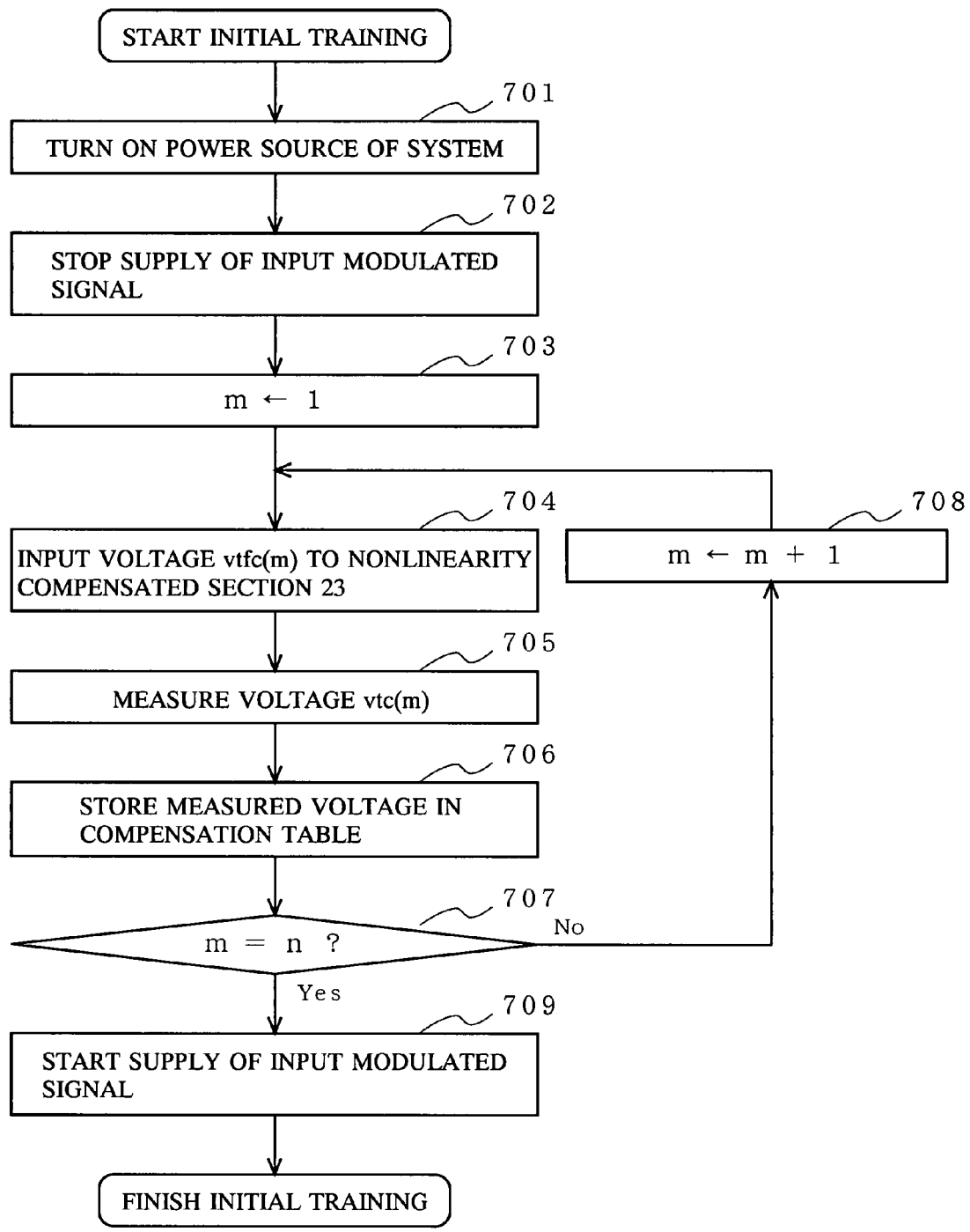
FIG. 7 is a flowchart illustrating steps of an initial training performed in the VCO nonlinear compensation system of the present invention.
Figure 8:
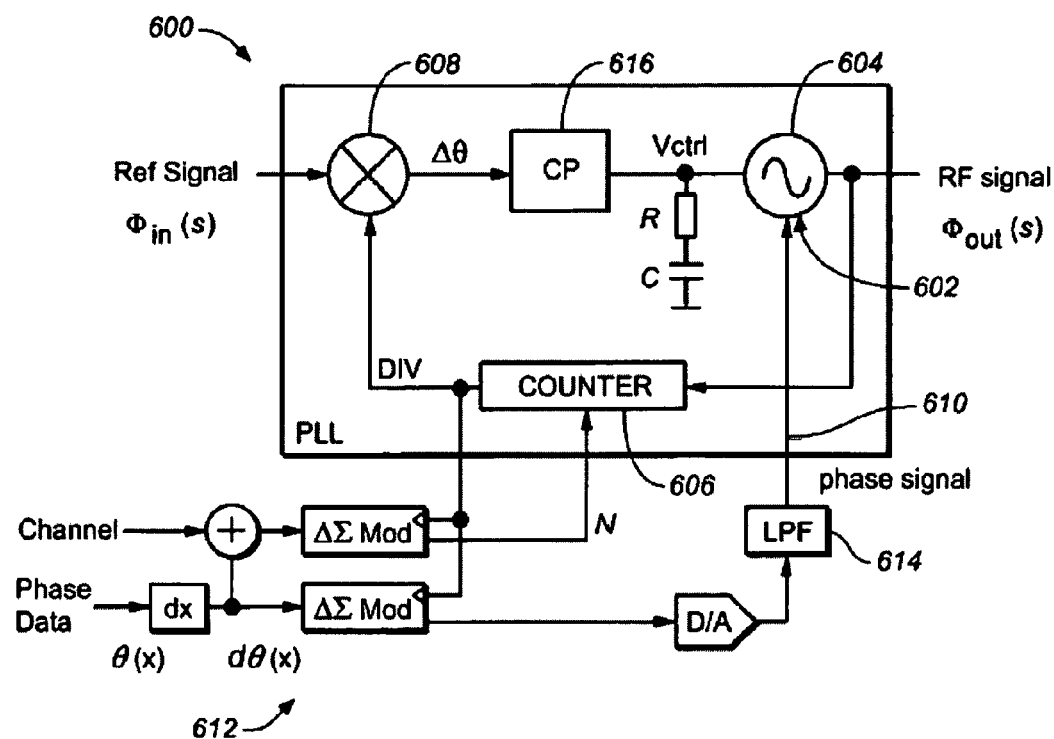
FIG. 8 is a diagram illustrating a configuration of a conventional direct synthesis modulator 600.

FIG. 7 is a flowchart illustrating steps of the initial training performed in the VCO nonlinear compensation system of the present invention.

The initial training starts when the power source of the VCO nonlinear compensation system is turned on (step S701). While the initial training is performed, a supply of the input modulated signal to the first adder 12 and the multiplier 22 is stopped (step S702). The frequency controlling section 11 sequentially outputs the voltages vtfc (1) to vtfc (n) to the nonlinearity-compensated section 23 (steps S703, S704, S707 and S708). The nonlinearity-compensated section 23 sequentially measures the voltages vtc (1) to vtc (n) corresponding to the voltages vtfc (1) to the vtfc (n), respectively, and stores the measured voltages vtc (1) to vtc (n) in the compensation table (steps S705 and S706). When a creation of the compensation table is completed, a stoppage of supplying the input modulated signal to the first adder 12 and the multiplier 22 is released, and a normal operation is started (steps S707 and S709).

According to the third embodiment, an aged deterioration of the VCO nonlinear compensation system and a characteristic deterioration caused by variations between the VCO nonlinear compensation systems can be corrected when the product is operated. Note that the compensation table does not have to be necessarily created when the product is adjusted in the factory. The compensation table may be created only by performing the initial training.

While the invention has been described in detail, the foregoing description is in all aspects illustrative and not restrictive. It is understood that numerous other modifications and variations can be devised without departing from the scope of the invention.

What is claimed is:

1. A system for compensating for a nonlinearity of a voltage-controlled oscillator, the system comprising:
    a loop filter operable to suppress a high-frequency component of an input modulated signal;
    a voltage-controlled oscillator operable to control an oscillatory frequency in accordance with a signal outputted from the loop filter so as to perform a frequency modulation on the input modulated signal;
    a feedback processing section operable to compare a frequency modulated signal outputted from the voltage-controlled oscillator with the input modulated signal and operable to control, based on a comparison result, the frequency of the input modulated signal to be inputted to the loop filter; and
    a nonlinearity-compensated section operable to retain a compensation table in which a voltage vtfc for setting a center frequency of the frequency modulated signal is associated with a voltage vtc of the signal outputted from the loop filter, and operable to add, when the frequency modulated signal is oscillated at a center frequency fc, a compensation value to the input modulated signal, the compensation value being calculated based on a difference between a pair of the voltage vtfc and the voltage vtc, in the compensation table, both of which are associated with the center frequency fc and another pair of the voltage vtfc and the voltage vtc, in the compensation table, both of which are associated with a frequency other than the center frequency fc.

2. The system according to claim 1, further comprising an offset setting section operable to retain an offset value changed in accordance with a change in an environmental temperature and determining, based on the voltage vtc which is actually obtained, the offset value to be assigned to values in the compensation table, wherein
    the nonlinearity-compensated section adds the offset value determined by the offset setting section to the values in the compensation table.

3. The system according to claim 1, wherein
    the compensation table is created when a product is adjusted in a factory.

4. The system according to claim 1, wherein
    the compensation table is created when a power source of the system is turned on.

* * * * *